United States Patent
Freeman et al.

(10) Patent No.: US 10,318,669 B2
(45) Date of Patent: Jun. 11, 2019

(54) ADAPTIVE FORECASTING OF TIME-SERIES

(71) Applicant: International Business Machines Corporation, Armonk, NY (US)

(72) Inventors: Mark A. Freeman, Columbus, OH (US); Michael E. Girata, Lewis Center, OH (US); Mark R. Grabau, Westerville, OH (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 334 days.

(21) Appl. No.: 15/184,604

(22) Filed: Jun. 16, 2016

(65) Prior Publication Data

US 2017/0364614 A1    Dec. 21, 2017

(51) Int. Cl.
*G06F 17/50*    (2006.01)
*G06Q 30/02*    (2012.01)

(52) U.S. Cl.
CPC ..... *G06F 17/5009* (2013.01); *G06Q 30/0201* (2013.01)

(58) Field of Classification Search
CPC .................................................. G06F 17/5009
See application file for complete search history.

(56) References Cited

U.S. PATENT DOCUMENTS

| | | | |
|---|---|---|---|
| 7,251,589 B1 * | 7/2007 | Crowe | G06F 17/18 702/181 |
| 7,716,022 B1 | 5/2010 | Park et al. | |
| 8,014,983 B2 | 9/2011 | Crowe et al. | |
| 9,047,559 B2 | 6/2015 | Brzezicki et al. | |
| 9,189,750 B1 * | 11/2015 | Narsky | G06N 99/005 |
| 2006/0074828 A1 * | 4/2006 | Heumann | G06K 9/6217 706/20 |
| 2006/0212279 A1 * | 9/2006 | Goldberg | G06N 3/126 703/2 |

(Continued)

OTHER PUBLICATIONS

Zou et al. "Combining time series models for forecasting" International Journal of Forecasting, vol. 20 (2004), pp. 69-84 [retrieved on Jun. 21, 2018]. Retrieved from <https://www.sciencedirect.com/science/article/pii/S0169207003000049>.*

(Continued)

*Primary Examiner* — Aniss Chad
*Assistant Examiner* — Alfred H B Wechselberger
(74) *Attorney, Agent, or Firm* — Garg Law Firm, PLLC; Christopher K. McLane

(57) ABSTRACT

For a time-series, a baseline error value is reduced to compute a target forecast error value by maximizing a net benefit value of a forecasted value of the time-series. For each forecasting model in a set of models, a corresponding model error value related to the time-series is computed. From the set, a subset of models is selected where each model in the subset has a cost that will produce a positive value for the net benefit. A selected model from the subset is associated with the time-series such that a model error value of the selected model is at most equal to the target forecast error. The time-series is forecasted using the selected model such that the forecasted value has an error of less than the baseline error at a future time, and the forecasted value produces a positive net benefit at the future time.

16 Claims, 5 Drawing Sheets

(56) References Cited

U.S. PATENT DOCUMENTS

| | | | | |
|---|---|---|---|---|
| 2012/0116743 A1* | 5/2012 | Ayala | ............... | G06F 17/30557 |
| | | | | 703/13 |
| 2014/0325151 A1* | 10/2014 | Kim | ................ | G06F 17/30221 |
| | | | | 711/117 |
| 2015/0019185 A1* | 1/2015 | Cunningham | ...... | G06F 17/5009 |
| | | | | 703/6 |
| 2015/0088606 A1* | 3/2015 | Tyagi | ................ | G06Q 30/0202 |
| | | | | 705/7.31 |
| 2015/0120263 A1* | 4/2015 | Brzezicki | .............. | G06N 7/005 |
| | | | | 703/6 |
| 2015/0160098 A1* | 6/2015 | Noda | .................. | G05B 23/024 |
| | | | | 702/35 |
| 2016/0292196 A1* | 10/2016 | Yan | .................... | G06Q 30/0246 |
| 2017/0091622 A1* | 3/2017 | Taylor | .................... | G06F 17/18 |

OTHER PUBLICATIONS

Lozano et al. "Spatial-temporal Causal Modeling for Climate Change Attribution" [proceeding] KDD'09, Paris, France, pp. 587-596; doi:10.1145/1557019.1557086 [retrieved on Jan. 17, 2019]. Retrieved from <https://dl.acm.org/citation.cfm?id=1557086> (Year: 2009).*

Yan et al.; Probabilistic Modeling for Hierarchical Time Series Forecasting, Nov. 27, 2014.

IBM; Time series analysis—Semi-automated selection of Arima Model Type and Parameters, Jul. 12, 2007.

* cited by examiner

ADAPTIVE FORECASTING OF TIME-SERIES

TECHNICAL FIELD

The present invention relates generally to a method, system, and computer program product for forecasting numerous time-series in an automated manner. More particularly, the present invention relates to a method, system, and computer program product for adaptive forecasting of time-series.

BACKGROUND

Data emitted over a period by a data source is also called a time-series. In statistics, signal processing, and many other fields, a time-series is a sequence of data points, measured typically at successive times, spaced according to uniform time intervals, other periodicity, or other triggers. An input time-series is a time-series that serves as input data. An output time-series is a time-series that is data produced from some processing. A time-series may be an output time-series of one object and an input time-series of another object.

Time-series analysis is a method of analyzing time-series, for example to understand the underlying context of the data points, such as where they came from or what generated them. As another example, time-series analysis may analyze a time-series to make forecasts or predictions. Time-series forecasting is the use of a forecasting model to forecast future events based on known past events, to wit, to forecast future data points before they are measured. An example in econometrics is the opening price of a share of stock based on the stock's past performance, which uses time-series forecasting analytics.

Time-series forecasting uses one or more forecasting models to regress a dependent factor on independent factors. For example, if an automotive dealer has been selling cars very quickly, the speed of sale is an example of an independent factor. A forecasting model regresses on historical data to predict the future sale rates. The future rate of sale is a dependent factor.

SUMMARY

The illustrative embodiments provide a method, system, and computer program product. An embodiment includes a method that reduces, using a processor and a memory, for a time-series, a baseline error value to compute a target forecast error value, wherein the reducing maximizes a net benefit value of a forecasted value of the time-series. The embodiment computes, for each forecasting model in a set of forecasting models, a corresponding model error value, wherein the model error value is related to the time-series. The embodiment selects from the set of forecasting models, a subset of forecasting models, wherein each member model of the subset has a cost that will produce a positive value for the net benefit value. The embodiment associates with the time-series, a selected model from the subset such that a model error value of the selected model is at most equal to the target forecast error value. The embodiment forecasts the time-series using the selected model, wherein the forecasting predicts the forecasted value of the time-series at a future time such that the forecasted value has an error of less than the baseline error value relative to an actual value of the time-series at the future time, and such that the forecasted value produces a positive net benefit value at the future time.

An embodiment includes a computer usable program product. The computer usable program product includes one or more computer-readable storage devices, and program instructions stored on at least one of the one or more storage devices.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
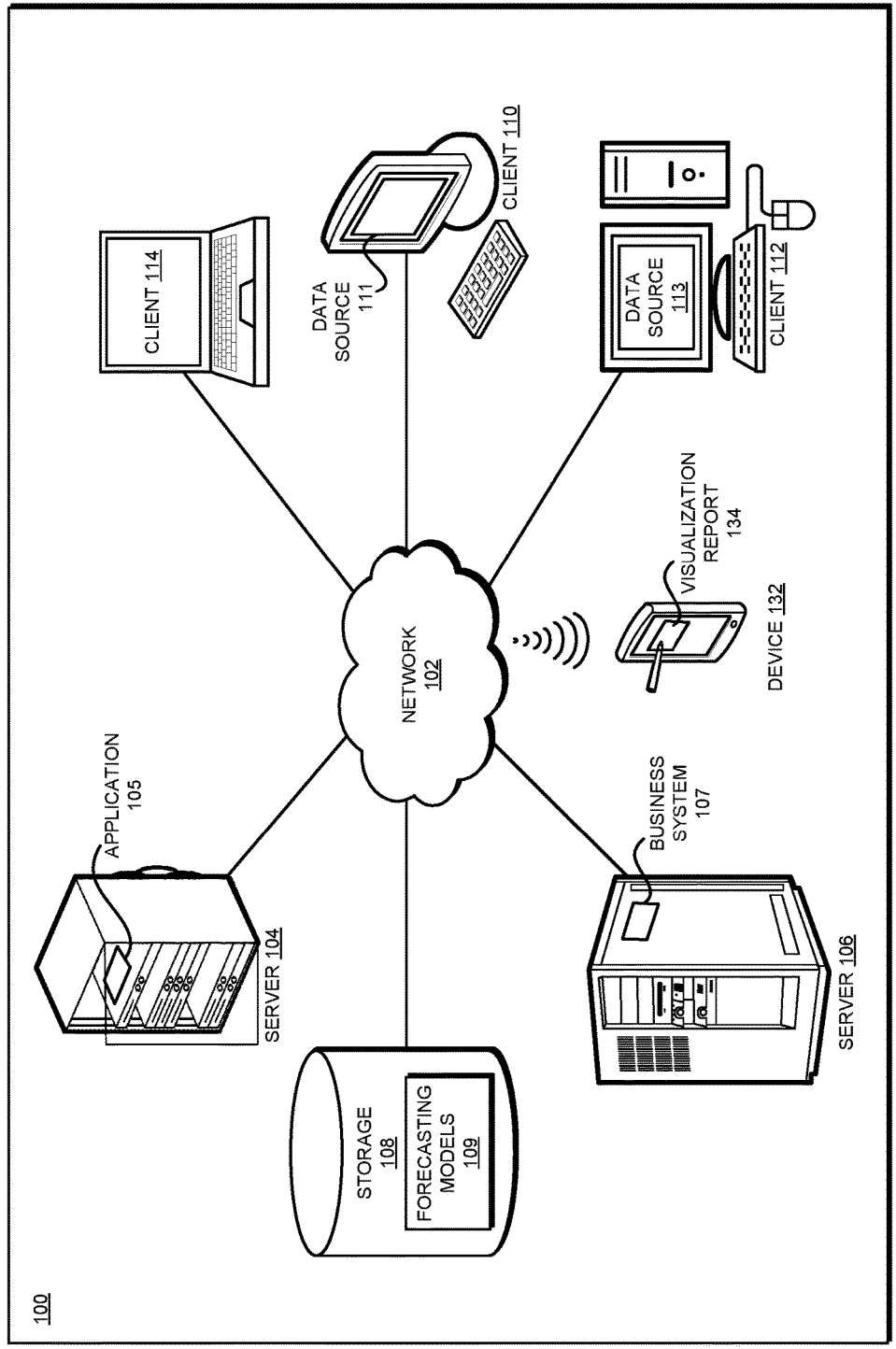
FIG. 1 depicts a block diagram of a network of data processing systems in which illustrative embodiments may be implemented.

A forecasting model (also known as a forecaster, a predictive model, a prediction model, or an autoregressive model) is a software-implemented algorithm to forecast—or predict—a value, output, or outcome expected in the time-series at some point in time in the future. The forecasting model accepts as input the values that have already occurred in the time-series and produces one or more forecasted values in the time-series with an expected amount of error. The amount of error is the difference between a forecasted value at future time T and an actual value when the actual value occurs at time T in the future. The amount of error is called a forecasting error.

Forecasting gives businesses the opportunity to predict what will happen in the near future. By having these insights, businesses can better plan their operations to decrease costs and increase revenue.

The illustrative embodiments recognize that forecasting thousands of series is common in the data processing environments of many business enterprises. Forecasting numerous time-series is computationally expensive and can take hundreds of person hours. For example, on average, it takes an experienced data scientist 20 minutes to manually forecast a time-series. Some business cases require the forecasting of 6,000 time-series. To forecast these series, it would take one data scientist 6,000 series*20 minutes=120,000 minutes=2,000 hours=250 work days.

Thus, the illustrative embodiments recognize that in many cases, by the time the forecasts are generated, a business opportunity dependent upon the forecast may be lost.

One existing solution for speeding up the forecasting of a large number of time-series includes hiring more data scientists. However, the illustrative embodiments recognize that adding resources reduces the time needed to prepare the forecast but increases the cost of the forecasting exercise.

The illustrative embodiments recognize that the presently available forecasting solutions suffer from a variety of limitations. For example, some forecasting systems implement only some forecasting algorithms and not others, making the selection of a suitable algorithm artificially constrained. As another example, some other forecasting systems implement a forecasting function that must be called for each time-series. For example, while the time to execute the function and produce a forecast for each series may be shorter than the time needed for manual forecasting, if 6,000 time-series have to be forecasted, the function has to be executed at least 6,000 times. The cumulative time for forecasting a large number of time-series is still prohibitive in such solutions.

Furthermore, the presently available forecasting solutions are not even structured to forecast sparse time-series that are often associated with slow-moving products. A non-limiting example of a slow-moving product that would give rise to a sparse time-series may be a product that has three periods of no demand, followed by two periods with positive demand, then four periods with no demand, then one period with demand, etc. Many presently available forecasting solutions require a deep understanding of the forecasting models, custom coding to select and operate the forecasting models on the given time-series data, or both. The illustrative embodiments recognize that these and other limitations of the presently available forecasting solutions make them inadequate for forecasting large number of time-series.

The illustrative embodiments used to describe the invention generally address and solve the above-described problems and other problems related to forecasting time-series, and automate the process of forecasting any number of time-series while still maintaining data scientist accuracy.

The automated forecasting according to the illustrative embodiments is further adaptive to an error threshold set by the entity that will consume the forecast, a net benefit that the entity expects to derive from the forecast, or both. Net benefit is the difference between a total benefit expected from a forecast and a cost of producing the forecast.

An embodiment can be implemented as a software application. The application implementing an embodiment can be configured as a modification of an existing forecasting system, as a separate application that operates in conjunction with an existing forecasting system, a standalone application, or some combination thereof.

For every series, an embodiment calculates the Akaike Information Criterion (AIC) for the forecast versus the in-sample data used to calculate the forecasting model.

$$AIC = 2k - 2\ln(L) + \frac{2k(k+1)}{n-k-1}$$

L=maximum value of the likelihood function
k=number of parameters in the model
n=number of periods used to calculate the model.

For Moving Average models k=1, and the k value of Exponential Smoothing and Autoregressive Integrated Moving Average (ARIMA) models is dependent on the model.

The advantage of using the AIC as opposed to other error-calculation statistics is that a model is penalized for having extra parameters, a common cause of over-fitting in modeling. The embodiment calculates the AIC for each available model in a similar manner, and the different models can be compared with one another based on their AIC values.

A benefit from a forecast can be quantified in any suitable manner. For example, a benefit of a forecast may be reduced future inventory when sales are forecasted to drop—and therefore reduced cost; increased inventory when sales are forecasted to rise—and therefore increased revenues; staffing adjustments resulting in personnel cost; and many other benefits realized and quantified by business enterprises. A benefit from a forecast increases with a reduction in the forecast error associated with that forecast. Reducing the error in a forecast, e.g., by increasing an accuracy of the forecast, often requires additional computations. Consequently, a cost of the forecast is also likely to increase with a reduction in the error associated with that forecast. An embodiment balances the benefits and costs associated while achieving greater forecast accuracy by setting a target forecast error.

A baseline forecast error, or a baseline error, is a forecast error that is a function of a forecast error value that may be acceptable for a purpose. For example, the entity may specify the error in dollars, and a function of the dollar amount may result in a baseline error value number of items. As another example, the entity may specify the error in terms of a number of items, and the baseline error value may be that number of items or a function of that number of items.

For example, if the sales of automobiles are being forecast, an entity selling cars may accept a forecast error of 3 cars per 100 cars sold during the forecast period. A target forecast error is a forecast error value associated with a time-series' forecast where the net benefit, i.e., total benefit expected from the forecast minus the cost of producing the forecast, is maximized. For example, if the cost of reducing the forecast error from 3 cars per 100 to 2 cars per 100 is less than the profit (total expected benefit) from the sale of the additional car, then the target forecast error may be 2 cars per 100 because the net benefit is still a positive number from the error reduction.

Every series has a baseline forecast error, along with an optimal reduction in forecast error, given the benefits and costs associated with the model used for the forecasting. For example, one forecast model may have a cost that exceeds the total expected benefit from the additional car sold, making the reduction of the forecast error not desirable with that model. However, another forecast model may have a cost that is less than the total expected benefit from the additional car sold, making the reduction of the forecast error desirable with that other model.

Once a model is found that achieves this optimal reduction, the embodiment selects that model to generate the forecast for the series. The embodiment then moves on to select a model for the next series in a similar manner.

Stated another way, in one non-limiting implementation of an embodiment, suppose that forecasts have to be computed for i=1 . . . N time-series. Each series has a baseline forecast error, $\sigma_{0i}$. An embodiment solves the following optimization problem for each time-series i:

$$\max_t b_i \sigma_{0i}(1 - e^{-a[\sigma_0]t}) - ct \quad (1)$$

to identify a reduction in baseline forecast error ($\sigma_{0i}$) that maximizes net benefits: benefits ($b_i$) less costs ($c$).

The potential reduction in error is driven by the functional $a[\sigma_0]$, which measures the benefit elasticity of a 1% reduction in forecast error, and is increasing in the baseline forecast error. Using available data on this elasticity for baseline forecast errors in the range 40-85%, the functional can be closely approximated as:

$$a[\sigma_0] = \begin{array}{ll} 0.016 & \sigma_{0i} < 30\% \\ e^{-3.72 - 2.65\sigma_{0i} + 4.48\sigma_{0i}^2} & 30\% \leq \sigma_{0i} \leq 100\% \\ 0.151 & \sigma_{0i} > 100\% \end{array}$$

Differentiating (1) and solving for t yields the following solution for series i:

$$t_i^* = \frac{1}{a_i} \ln\left(\frac{a_i b_i \sigma_{0i}}{c}\right) \geq 0 \quad (2)$$

Here, t counts the number of percentage reductions from baseline forecast error, which is constrained non-negative. A higher optimal reduction is implied by a higher benefit elasticity (a) a higher benefit (b) and a higher baseline error ($\sigma_0$). A lower optimal reduction is implied by higher modeling cost (c).

From (2) the embodiment calculates a target forecast error for each series:

$$\sigma_i^* = \sigma_{0i}(1 - 0.01)^{t_i^*} \quad (3)$$

As t increases, the target forecast error becomes smaller.

This method of forecasting time-series according to the illustrative embodiments significantly reduces the time to generate a large number of forecasts, while extra time is spent searching for improved forecasts for series with a higher business impact.

Occasionally, or upon an event, an embodiment compares the forecasted value with an actual value that occurs at the forecasted time. If for a forecasted time-series the error between the forecast and the actual value exceeds a threshold, the embodiment recomputes the target forecast error value and selects another model for forecasting that time-series.

After all of the models have been evaluated, another embodiment averages the forecasts from the two best models to create an ensemble forecast. The embodiment computes the AIC for this ensemble forecast and compares to the AIC from the previous best model. The model with the lower AIC is selected and a forecast is generated.

The embodiment forecasts sparse time-series as follows—when a time-series with data points more than a threshold distance apart is to be forecast, the embodiment combines similar sparse time-series from different data sources together to form a combined time-series. The embodiment forecasts the combined time-series and computes an allocation of the forecast for the various contributing data sources. The embodiment distributes the forecast value to the different data sources according to their respective allocations.

A method of an embodiment described herein, when implemented to execute on a device or data processing system, comprises substantial advancement of the functionality of that device or data processing system in forecasting a large number of time-series in an automated and benefit-adaptive manner. For example, presently available methods for forecasting a set of time-series relies primarily on either data scientists or repetitive execution of forecasting models. An embodiment provides a method for evaluating a target forecast error for each time-series in the set of time-series. The target forecast error is a function of a forecast error that is acceptable to a forecast consumer and a benefit amount that the consumer expects to derive from the forecast. An embodiment selects a subset of a set of forecast models based on a cost associated with the models. To perform such an identification, the embodiment uses the AIC values computed for the various models. An embodiment selects the first model from the subset that provides an error of less than or equal to the target forecast error and has a positive net benefit. This manner of adaptive forecasting of time-series is unavailable in the presently available methods. Thus, a substantial advancement of such devices or data processing systems by executing a method of an embodiment is in efficient, automated, benefit-adaptive forecasting of a large number of time-series.

The illustrative embodiments are described with respect to certain types of data sources, time-series, error values, optimizations, benefits, costs, forecasting models, devices, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
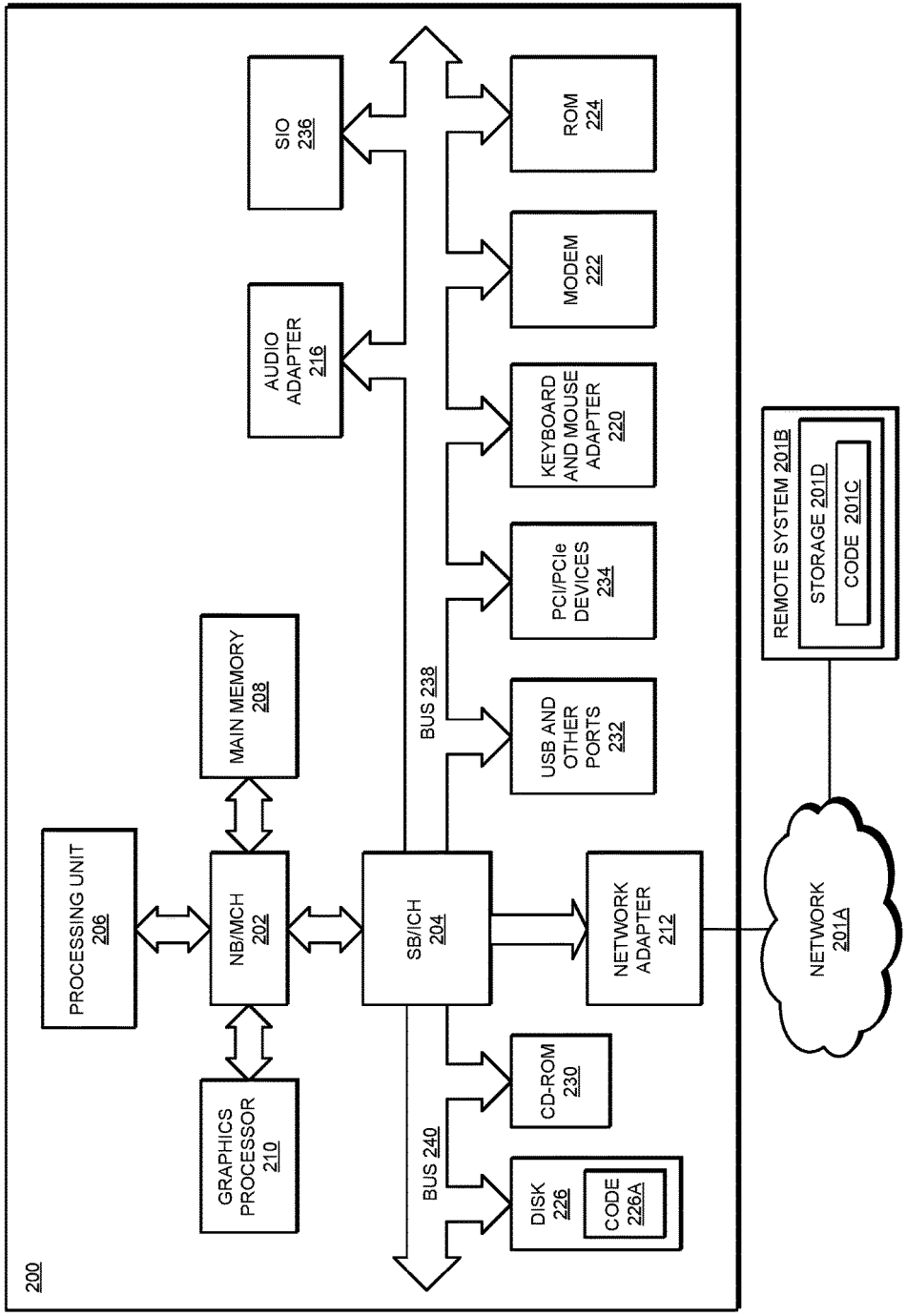
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Business system 107 is a data processing system of a business enterprise that consumes a forecast, specifies an acceptable error, specifies a total benefit expected from a forecast, or some combination thereof. Forecasting models 109 is a set of forecasting models usable for forecasting a time-series in a manner described herein. Data sources 111, and 113 are some examples of any number of data sources that can supply the data of a set of time-series. Application 105 forecasts the data points of all or a subset of the set of time-series in a manner described herein. Interface 134 presents the forecast results to a user. In some cases, an embodiment can be adapted to present the forecast visually, such as in the form of graphs and charts.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. In another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
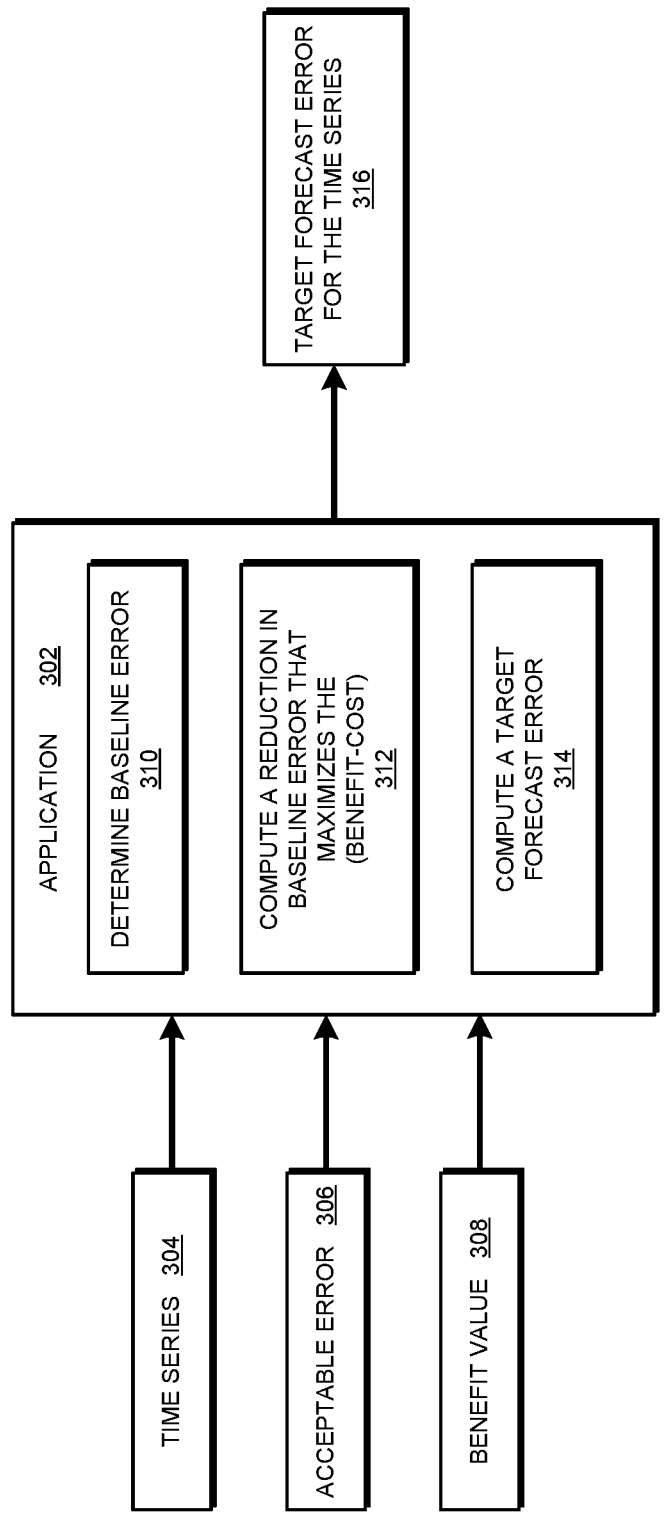
FIG. 3 depicts a block diagram of an example configuration for computing a target forecast error in accordance with an illustrative embodiment.

With reference to FIG. 3, this figure depicts a block diagram of an example configuration for computing a target forecast error in accordance with an illustrative embodiment. Application 302 is an example of application 105 in FIG. 1.

Time-series 304 is an example time-series from a data source, such as from data source 111 in FIG. 1, and is a member of a set of time-series which has to be forecasted. Acceptable error 306 is an acceptable error value provided by a business system, e.g., business system 107 in FIG. 1. Benefit value 308 is a total benefit value that business system 107 of FIG. 1 expects from a forecast of time-series 304.

Component 310 computes a baseline error value from acceptable error 306. As described herein, component 310 may apply a suitable function to acceptable error value 306 to obtain the baseline error value.

Component 312 computes a reduction in the baseline error. Particularly, the reduction is computed such that a net benefit from the reduction of the error is maximized. Component 314 computes target forecast error value 316 for the time-series based on the reduction determined by component 312. Target forecast error value 316 is the $\sigma_i^*$ value described earlier, where time-series 304 is time-series i.

Figure 4:
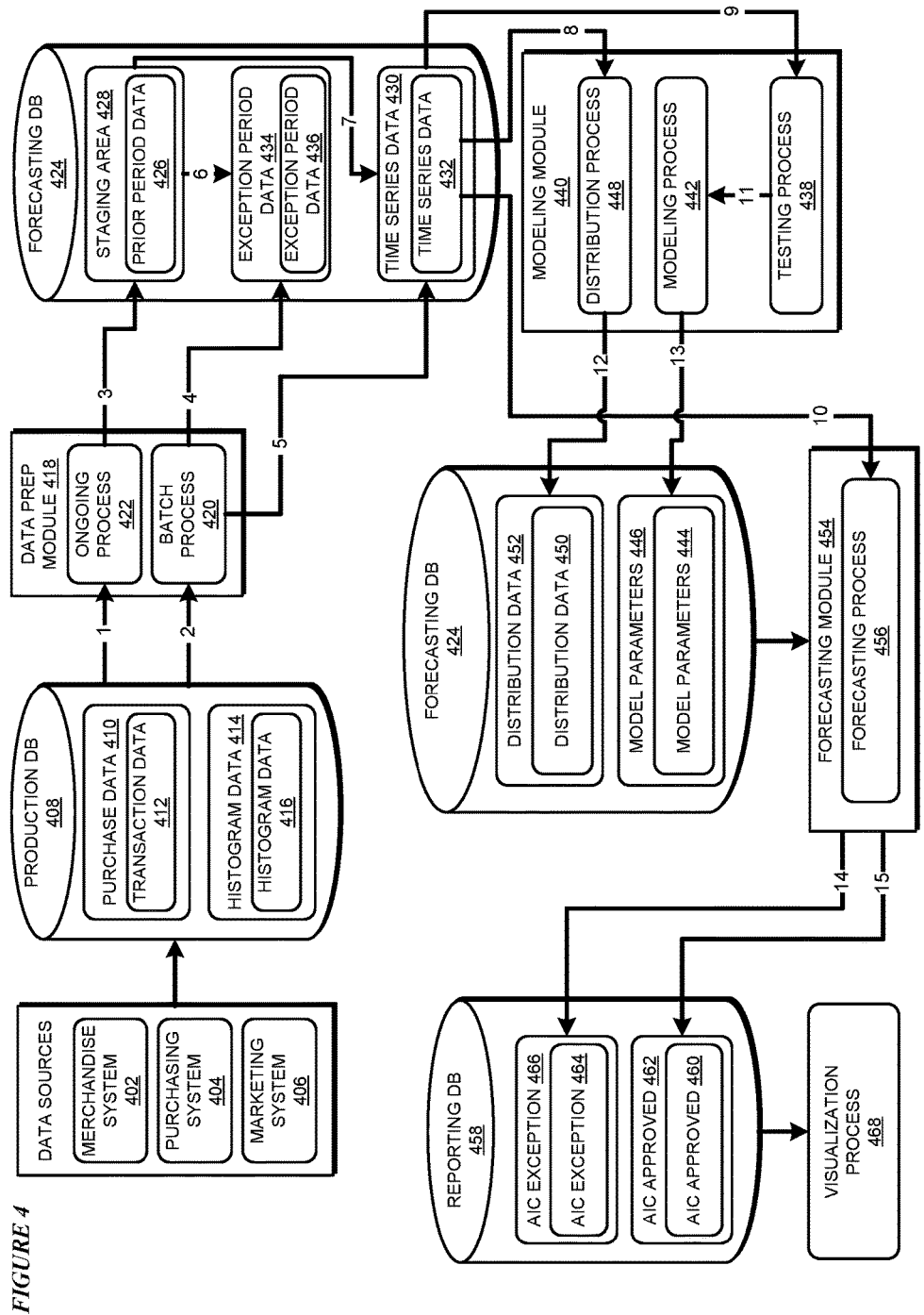
FIG. 4 depicts a block diagram of an example configuration for adaptive forecasting of time-series in accordance with an illustrative embodiment.

With reference to FIG. 4, this figure depicts a block diagram of an example configuration for adaptive forecasting of time-series in accordance with an illustrative embodiment. Certain operations described with respect to this figure can be implemented in application 302 of FIG. 3.

Only as an example, a retailing business environment is used herein to describe the operations of an embodiment. These examples of the retailing entity and components thereof are not intended to be limiting. From this disclosure, those of ordinary skill in the art will be able to conceive many other entities and components thereof for which an embodiment can be adapted, and such entities, components, and adaptations are contemplated within the scope of the illustrative embodiments.

Any number of data sources, such as data sources 111 and 113 in FIG. 1, can supply any number of time-series in a given environment. Suppose that merchandising system 402 is a data source that provides merchandising data time-series in a retail business entity. For example, merchandising system 402 provides the description of the products sold over a period, e.g., [2013, red, 2-door, 4-wheel drive vehicle], etc.

Similarly, purchasing system 404 is a data source that provides purchase transactions-related data time-series in the entity. For example, purchasing system 404 provides the data points about individual purchase transactions over a period, e.g., the number of pick-up trucks sold during the period.

Marketing system 406 is another data source that provides marketing-related data time-series in the entity. For example, marketing system 406 provides the data points about marketing events and promotions over a period.

In a non-limiting example configuration, production database 408 stores the data of incoming time-series from the data sources in one of two storage areas, e.g., tables. Purchase data table 410 holds transaction data 412 from purchasing system 404 and histogram data table 414 holds data 416 from merchandise system 402 and marketing system 406.

Production database 408 provides initial data load (2) and subsequent data load (1) about incremental data updates to the initial data load. Data loads 1 and 2 are provided to data preparation module 418, which can be implemented as a component of application 302 in FIG. 3.

All historical data is sent to batch process 420 in initial load 1. The operation of batch process 420 prepares and appropriately formats the data for forecasting. As new data is collected, it is sent to ongoing process 422 in subsequent loads 2, where the new data is also formatted and prepared for forecasting.

After batch process 420, the data is segmented into two groups, valid data (5) which is ready for forecasting and exception data (4). Exception data 4 is low quality data that will need to be examined by a data scientist. From ongoing process 422, all prior period data (3) is sent to forecasting database 424.

Prior period data 426 (3) from ongoing process 422 is stored in staging area 428. Valid data (7) is sent to time-series data table 430 containing time-series data 432 from batch process 420, and exception data (6) is sent to exception period data table 434 with exception data 436 from batch process 420.

Time-series data 432 (9) is sent to testing process 438 in modeling module 440. Modeling module 440 can be implemented as a component of application 302 in FIG. 3. Characteristics that describe the time-series are calculated in testing process 438. These characteristics include, but are not limited to, the amount of differencing needed for stationarity, the transformation needed (if any) to produce an accurate forecast, and descriptions of the data that can be used to eliminate inaccurate models from consideration.

From testing process 438, time-series and parameter ranges (11) are sent to modeling process 442. Modeling process 442 is where all of the available models are evaluated for the series, and the model with the lowest AIC is selected to product the forecast of the series. Model parameters 444 (13) of the optimal model are then sent to model parameters table 446 in forecasting database 424.

Distribution data (8) is used to determine what percentage of the forecast should be allocated to each entity that contributes data to a sparse time-series as described herein. Distribution process 448 computes the allocations for each contributing entity. These allocations form distribution data 450 (12), which are sent to distribution data table 452 in forecasting database 424.

Distribution data table 452 contains data explaining what percentage of the total series should be allocated to each entity. Model parameters table 446 contains the parameters of the optimal model chosen for the series being evaluated.

Forecasting module 454 can be a component in application 302 in FIG. 3. Forecasting module 454 implements forecasting process 456, which executes the chosen forecasting model on time-series data (10) to produce a forecast of the time-series using model parameters 444 and distribution data 450 from forecasting database 424.

After forecasts are generated, the results move to one of two tables in reporting database 458. If the AIC value is below a specified cut-off point, the forecast result is classified as forecasted product (15) and it is sent as AIC approved forecast 460 in AIC approved table 462. If the AIC value is above the cut-off point, the forecasted series is classified as exception product (14) and is sent as AIC exception data 464 to AIC exception table 466.

After the forecasts in AIC exception table 466 are further examined by a data scientist, all forecasts in reporting database 458 are sent to visualization process 468. Visualization process 468 can be implemented as a component in application 302 in FIG. 3, and can be configured to render the forecasted data as graphs, tables, charts, and other visual representations to provide actionable insights.

Figure 5:
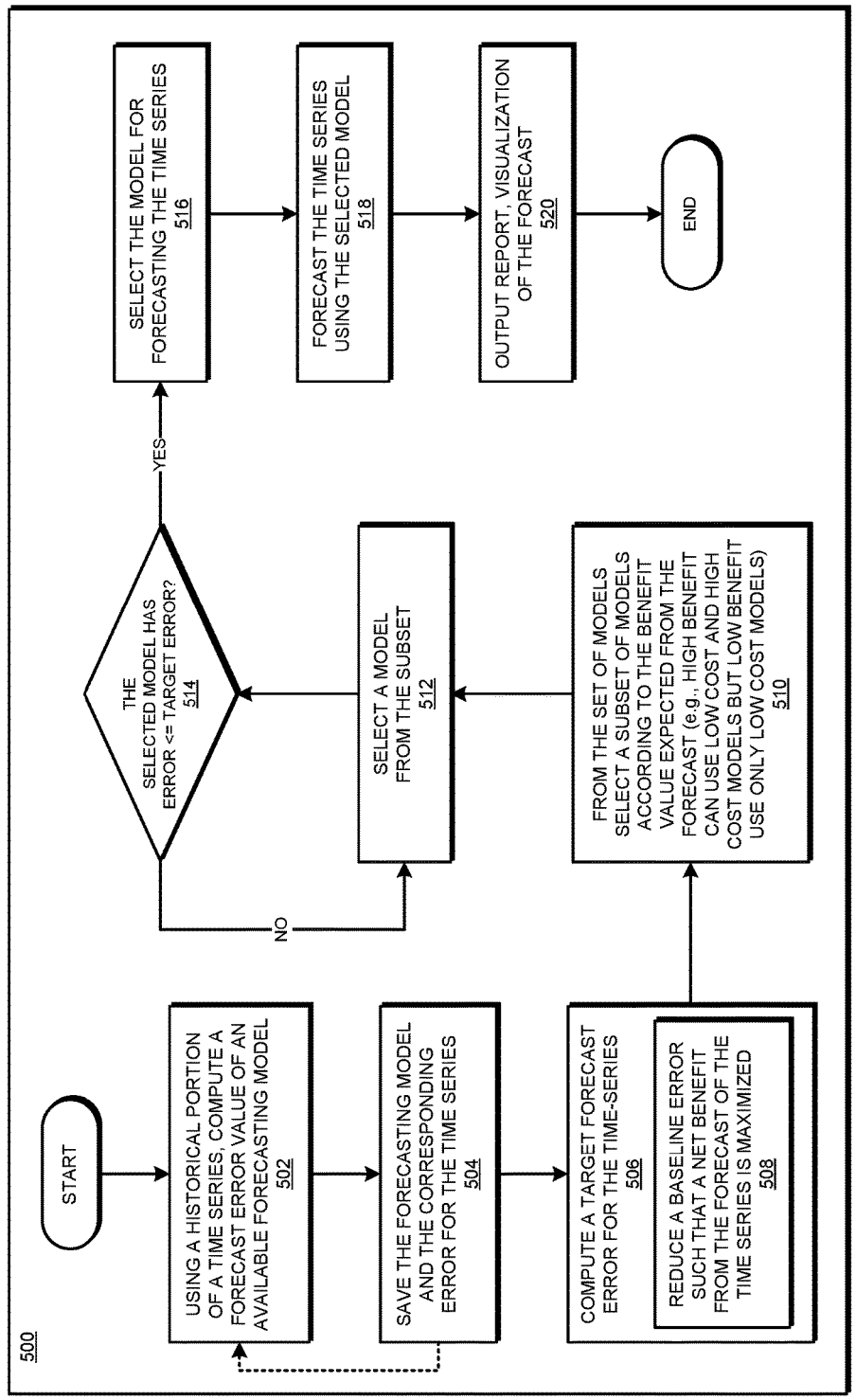
FIG. 5 depicts a flowchart of an example process for adaptive forecasting of time-series in accordance with an illustrative embodiment.

With reference to FIG. 5, this figure depicts a flowchart of an example process for adaptive forecasting of time-series in accordance with an illustrative embodiment. Process 500 can be implemented in application 302 in FIG. 3.

The application, using a historical portion of a time-series, computes a forecast error value of an available forecasting model (block 502). In one embodiment, this computation produces the AIC value corresponding to the forecasting model as described herein.

The application saves the model and the corresponding computed error value for the time-series in a repository (block 504). The application repeats blocks 502 and 504 for as many models as may be available in a given implementation, for as many time-series that may have to be forecasted in the implementation.

The application computes a target forecast error value for the time-series (block 506). Specifically, in block 506, the application computes a reduction in a baseline error value such that a net benefit from the forecast is maximized (block 508).

The application selects a subset of models from the set of models in the repository (block 510). The selection of block 510 is according to the expected benefit from the forecast. For example, if the benefit is expected to exceed a high threshold, then the models whose costs are below a lower threshold as well as the models whose costs are between the lower threshold and the high threshold can be selected. However, if the benefit is expected to exceed only the lower threshold, then the models whose costs are below a lower threshold can be selected but not the models whose costs are between the lower threshold and the high threshold.

The application selects a model from the subset (block 512). The application determines whether the error value associated with the selected model is less than or equal to the target error value computed in block 506 (block 514). If the error value associated with the selected model is not less than or equal to the target error value ("No" path of block 514), the application selects another model from the subset by returning to block 512.

If the error value associated with the selected model is less than or equal to the target error value ("Yes" path of block 514), the application selects the model for forecasting the time-series (block 516). The application forecasts the time-series using the model selected at block 516 (block 518). The application outputs the forecast, e.g., as a report, a visualization, or some combination thereof (block 520). The application ends process 500 thereafter. Any number of models can be optimally fitted to forecast any number of time-series in this manner.

Thus, a computer implemented method, system or apparatus, and computer program product are provided in the illustrative embodiments for adaptive forecasting of time-series and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
reducing, using a processor and a memory, for a time-series, a baseline error value to compute a target forecast error value, wherein the reducing maximizes a net benefit value of a forecasted value of the time-series;

computing, for each forecasting model in a set of forecasting models, a corresponding model error value, wherein the model error value is related to the time-series;
selecting from the set of forecasting models, a subset of forecasting models, wherein each member model of the subset has a cost that will produce a positive value for the net benefit value;
associating with the time-series, a selected model from the subset such that a model error value of the selected model is at most equal to the target forecast error value;
forecasting the time-series using the selected model, wherein the forecasting predicts the forecasted value of the time-series at a future time such that the forecasted value has an error of less than the baseline error value relative to an actual value of the time-series at the future time, and such that the forecasted value produces a positive net benefit value at the future time;
determining that a first time-series from a first data source has two data points at a distance exceeding a distance threshold;
selecting a second time-series from a second data source, wherein the first time-series and the second time-series have data points with a common characteristic;
combining, using the processor and the memory, the first time-series and the second time-series, to form the time-series;
computing, using the processor and the memory, a first allocation and a second allocation, wherein the first allocation is proportional to an amount of data from the first time-series in the time-series, and wherein the second allocation is proportional to an amount of data from the second time-series in the time-series;
attributing a first portion of the forecasted value to the first data source, wherein the first portion is a function of the first allocation and the forecasted value;
attributing a second portion of the forecasted value to the second data source, wherein the second portion is the function of the second allocation and the forecasted value; and
creating a visual representation of the forecasted value.

2. The method of claim 1, further comprising:
evaluating, by considering one model from the subset at a time, whether the model error value corresponding to the considered model is at most equal to the target forecast error value; and
selecting the selected model responsive to the selected model being the first considered model whose model error value is at most equal to the target forecast error value.

3. The method of claim 1, further comprising:
using, in the computing the model error value, a past portion of the time-series.

4. The method of claim 1, further comprising:
computing, prior to reducing the baseline error value to compute the target forecast error value, the baseline error value by applying a function to an acceptable error in the forecasted value.

5. The method of claim 1, further comprising:
determining a cost of computing the forecasted value; and
computing the net benefit value by subtracting the cost from a total benefit value expected from the forecasted value.

6. A computer usable program product comprising one or more computer-readable storage devices, and program instructions stored on at least one of the one or more storage devices, the stored program instructions comprising:

program instructions to reduce, using a processor and a memory, for a time-series, a baseline error value to compute a target forecast error value, wherein the reducing maximizes a net benefit value of a forecasted value of the time-series;

program instructions to compute, for each forecasting model in a set of forecasting models, a corresponding model error value, wherein the model error value is related to the time-series;

program instructions to select from the set of forecasting models, a subset of forecasting models, wherein each member model of the subset has a cost that will produce a positive value for the net benefit value;

program instructions to associate with the time-series, a selected model from the subset such that a model error value of the selected model is at most equal to the target forecast error value;

program instructions to forecast the time-series using the selected model, wherein the forecasting predicts the forecasted value of the time-series at a future time such that the forecasted value has an error of less than the baseline error value relative to an actual value of the time-series at the future time, and such that the forecasted value produces a positive net benefit value at the future time;

program instructions to determine that a first time-series from a first data source has two data points at a distance exceeding a distance threshold;

program instructions to select a second time-series from a second data source, wherein the first time-series and the second time-series have data points with a common characteristic;

program instructions to combine, using the processor and the memory, the first time-series and the second time-series, to form the time-series;

program instructions to compute, using the processor and the memory, a first allocation and a second allocation, wherein the first allocation is proportional to an amount of data from the first time-series in the time-series, and wherein the second allocation is proportional to an amount of data from the second time-series in the time-series;

program instructions to attribute a first portion of the forecasted value to the first data source, wherein the first portion is a function of the first allocation and the forecasted value;

program instructions to attribute a second portion of the forecasted value to the second data source, wherein the second portion is the function of the second allocation and the forecasted value; and program instructions to create a visual representation of the forecasted value.

7. The computer usable program product of claim 6, further comprising:

program instructions to evaluate, by considering one model from the subset at a time, whether the model error value corresponding to the considered model is at most equal to the target forecast error value; and program instructions to select the selected model responsive to the selected model being the first considered model whose model error value is at most equal to the target forecast error value.

8. The computer usable program product of claim 6, further comprising:

program instructions to use, in the computing the model error value, a past portion of the time-series.

9. The computer usable program product of claim 6, further comprising:

program instructions to compute, prior to reducing the baseline error value to compute the target forecast error value, the baseline error value by applying a function to an acceptable error in the forecasted value.

10. The computer usable program product of claim 6, further comprising:

program instructions to determine a cost of computing the forecasted value; and program instructions to compute the net benefit value by subtracting the cost from a total benefit value expected from the forecasted value.

11. The computer usable program product of claim 6, wherein the computer usable code is stored in a computer readable storage device in a data processing system, and wherein the computer usable code is transferred over a network from a remote data processing system.

12. The computer usable program product of claim 6, wherein the computer usable code is stored in a computer readable storage device in a server data processing system, and wherein the computer usable code is downloaded over a network to a remote data processing system for use in a computer readable storage device associated with the remote data processing system.

13. A computer system comprising one or more processors, one or more computer-readable memories, and one or more computer-readable storage devices, and program instructions stored on at least one of the one or more storage devices for execution by at least one of the one or more processors via at least one of the one or more memories, the stored program instructions comprising:

program instructions to reduce, for a time-series, a baseline error value to compute a target forecast error value, wherein the reducing maximizes a net benefit value of a forecasted value of the time-series;

program instructions to compute, for each forecasting model in a set of forecasting models, a corresponding model error value, wherein the model error value is related to the time-series;

program instructions to select from the set of forecasting models, a subset of forecasting models, wherein each member model of the subset has a cost that will produce a positive value for the net benefit value;

program instructions to associate with the time-series, a selected model from the subset such that a model error value of the selected model is at most equal to the target forecast error value;

program instructions to forecast the time-series using the selected model, wherein the forecasting predicts the forecasted value of the time-series at a future time such that the forecasted value has an error of less than the baseline error value relative to an actual value of the time-series at the future time, and such that the forecasted value produces a positive net benefit value at the future time;

program instructions to determine that a first time-series from a first data source has two data points at a distance exceeding a distance threshold;

program instructions to select a second time-series from a second data source, wherein the first time-series and the second time-series have data points with a common characteristic;

program instructions to combine the first time-series and the second time-series, to form the time-series;

program instructions to compute a first allocation and a second allocation, wherein the first allocation is proportional to an amount of data from the first time-series in the time-series, and wherein the second allocation is proportional to an amount of data from the second time-series in the time-series;

program instructions to attribute a first portion of the forecasted value to the first data source, wherein the first portion is a function of the first allocation and the forecasted value;

program instructions to attribute a second portion of the forecasted value to the second data source, wherein the second portion is the function of the second allocation and the forecasted value; and program instructions to create a visual representation of the forecasted value.

14. The computer system of claim 13, further comprising:
program instructions to evaluate, by considering one model from the subset at a time, whether the model error value corresponding to the considered model is at most equal to the target forecast error value; and program instructions to select the selected model responsive to the selected model being the first considered model whose model error value is at most equal to the target forecast error value.

15. The computer system of claim 13, further comprising:
program instructions to use, in the computing the model error value, a past portion of the time-series.

16. The computer system of claim 13, further comprising:
program instructions to compute, prior to reducing the baseline error value to compute the target forecast error value, the baseline error value by applying a function to an acceptable error in the forecasted value.

* * * * *